(12) United States Patent
Chang (10) Patent No.: US 7,332,779 B2
(45) Date of Patent: Feb. 19, 2008

(54) MEMORY WITH SPLIT GATE DEVICES AND METHOD OF FABRICATION

(75) Inventor: Peter L. D. Chang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 26 days.

(21) Appl. No.: 11/350,230

(22) Filed: Feb. 7, 2006

(65) Prior Publication Data

US 2006/0125011 A1 Jun. 15, 2006

Related U.S. Application Data

(62) Division of application No. 10/816,282, filed on Mar. 31, 2004, now Pat. No. 7,049,654.

(51) Int. Cl.
*H01L 29/94* (2006.01)

(52) U.S. Cl. ............... 257/365; 257/401; 257/316; 257/347; 257/758; 257/E27.07

(58) Field of Classification Search ................ 257/365
See application file for complete search history.

(56) References Cited

U.S. PATENT DOCUMENTS

| 6,137,134 A | 10/2000 | Nakagawa |
| 6,141,236 A | 10/2000 | Kengeri |
| 6,190,981 B1 | 2/2001 | Lin et al. |
| 6,243,293 B1 | 6/2001 | Van Houdt et al. |
| 6,396,108 B1 | 5/2002 | Krivokapic et al. |
| 6,831,310 B1 | 12/2004 | Mathew et al. |
| 2002/0114191 A1 | 8/2002 | Iwata et al. |
| 2002/0140106 A1 | 10/2002 | Kurjanowicz |
| 2004/0152245 A1 | 8/2004 | Madurawe |
| 2005/0121789 A1* | 6/2005 | Madurawe ............... 257/758 |

OTHER PUBLICATIONS

Fried, David et al., "High-Performance P-Type Independent-Gate FinFETs," IEEE Electron Device Letters, vol. 25, No. 4, Apr. 2004, pp. 199-201.
Fried, David et al., "Improved Independent Gate N-Type FinFET Fabrication and Characterization," IEEE Electron Device Letters, vol. 24, No. 9, Sep. 2003, pp. 592-594.
Kuo, Charles et al., "Capacitorless Double-Gate DRAM Cell Design for High Density Applications," IEDM, 2002, pp. 843-846.
Chan, Mansun et al., "Recessed-Channel Structure for Fabricating Ultrathin SOI MOSFET with Low Series Resistance," IEEE Electron Device Letters, vol. 15, No. 1, Jan. 1994, 3.

(Continued)

*Primary Examiner*—Tu-Tu Ho
(74) *Attorney, Agent, or Firm*—Blakely, Sokoloff, Taylor & Zafman LLP (57) ABSTRACT

A DRAM fabricated on an SOI substrate employing single body devices as memory cells without relying on a field through the insulative layer of the SOI is described. Floating body devices are defined by orthogonally disposed lines with both a front gate and back gate for each body being formed on the insulative layer.

3 Claims, 8 Drawing Sheets

OTHER PUBLICATIONS

Ohsawa, Takashi et al., "Memory Design Using a One-Transistor Gain Cell on SOI," IEEE Jrl of Solid-State Circuits, vol. 37, No. 11, Nov. 2002, pp. 1510-1522.

Nowak, Edward J. et al., "Turning Silicon on its Edge," IEEE Circuits & Devices Magazine, Jan./Feb. 2004, pp. 20-31.

Fried, David et al., "A Fin-Type Independent-Double-Gate NFET," AIMS Research Group, Cornell University, Ithaca, New York, undated, p. 45-46.

* cited by examiner

MEMORY WITH SPLIT GATE DEVICES AND METHOD OF FABRICATION

This is a divisional of application Ser. No. 10/816,282, filed on Mar. 31, 2004, now U.S. Pat. No. 7,049,654.

FIELD OF THE INVENTION

This invention relates to the field of dynamic, random-access memories (DRAMs), particularly those using one transistor floating body cells.

PRIOR ART AND RELATED ART

Most common DRAM cells store charge on a capacitor and use a single transistor for accessing the capacitor. More recently, a cell has been proposed which stores charge in a floating body of a transistor. A back gate is biased to retain charge in the floating body.

In one proposal, an oxide layer is formed on a silicon substrate and a silicon layer for the active devices is formed on the oxide layer (SOI substrate). The silicon substrate is used as the back gate, and consequently, must be biased relative to the silicon layer. Unfortunately, the oxide layer is relatively thick, requiring a relatively high voltage (e.g., 10 volts) for the bias.

Several structures have been proposed to reduce this relatively high bias potential, including use of a double gate floating body and silicon pillars. These structures are difficult to fabricate. This and other related technology is described at C. Kuo, *IEDM*, December 2002, following M. Chan Electron Device Letters, January 1994; C. Kuo, *IEDM*, December 2002, A Hypothetical Construction of the Double Gate Floating Body Cell;" T. Ohsawa, et al., *IEEE Journal of Solid-State Circuits*, Vol. 37, No. 11, November 2002; and David M. Fried, et al., "Improved Independent Gate N-Type FinFET Fabrication and Characterization," *IEEE Electron Device Letters*, Vol. 24, No. 9, September 2003.

DETAILED DESCRIPTION

In the following description, a memory and method for fabricating the memory is described. Numerous specific details are set forth, such as specific conductivity types, and metalization arrangements, in order to provide a thorough understanding of the present invention. It will be apparent to one skilled in the art, that the present invention may be practiced without these specific details. In other instances, well known processing steps and circuits have not been described in detail, in order not to unnecessarily obscure the present invention.

Figure 1:
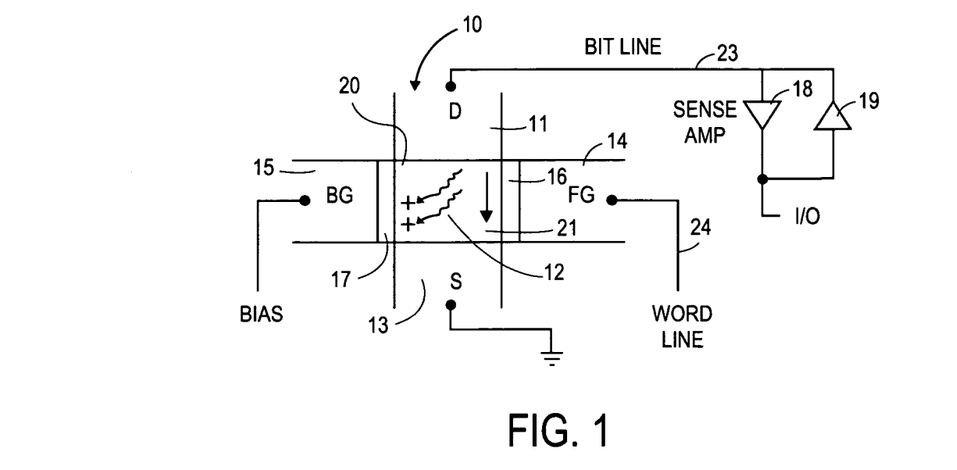
FIG. 1 is a plan view of a memory cell and its connections to the peripheral circuits in a memory.

A single memory cell is shown in FIG. 1. A portion of a silicon line 10, formed on an oxide layer, and etched from a silicon layer is illustrated. The line 10 includes a pair of spaced-apart, doped regions 11 and 13, disposed on first opposite sides of a body region 12. In one embodiment, the body region is a p type region, and the source region 13 and drain region 11 are more heavily doped with an n type dopant.

A pair of gates identified as a front gate 14 and back gate 15 are formed on second opposite sides of the body region 12. The gates 14 and 15 are insulated from the silicon body 12 by the oxide layers 16 and 17, respectively. The gates are formed from a conductive line of, for example, polysilicon, etched from a polysilicon layer. The polysilicon lines forming the gates are generally perpendicular to the silicon line 10 and are interrupted by the silicon line 10, at body regions such as at the body region 12.

The memory cell of FIG. 1 is a four-terminal device, coupled to the peripheral circuits of the memory. The cell is formed in an array of cells. For the n-channel embodiment illustrated, the source region is coupled to ground, and the back gate 15 is coupled to a source of bias, for example, −1 volt. The drain terminal 11 is connected to a bit line 23 in the memory. The front gate 14 is connected to a word line 24 in the memory to allow selection of the cell. The cell, as will be described, is a dynamic, random access memory cell, and as such, the data stored requires periodic refreshing.

Assume first, that the cell of FIG. 1 is not storing charge, and that the cell is selected by the application of a positive potential to the word line 24 which is coupled to the gate 14. Assume further, that a binary one is to be stored in (written into) the cell as represented by the storage of charge. (A binary 0 is represented by the absence of charge.) The amplifier 19 provides a positive potential to the bit line 23 causing conduction in the inversion channel 21 of the body region 12, as typically occurs in a field-effect transistor. As this occurs, hole pairs (resulting generally from impact ionization) drift towards the gate 15, under the influence of the bias applied to this gate. These hole pairs remain in the storage region 20 of the body region 12 after the potential is removed from the word line 24 and the potential is removed from the bit line 23.

Assume that it is necessary to determine whether the cell is storing a binary 1 or binary 0. The cell is selected by the application of a positive potential to the word line 23. The threshold voltage of the cell shifts, depending on whether holes are stored in the region 20. The cell has a lower threshold voltage, that is, it conducts more readily, when there is charge stored in the region 20. This shift in threshold voltage is sensed by the sense amplifier 18 and provides a reading of whether the cell is storing a binary 1 or binary 0. This can be provided to an I/O output line or to refresh circuitry to refresh the state of the cell.

The threshold voltage of the cell may be determined by comparing its threshold voltage to that of a reference cell in a cross-coupled sense amplifier. The threshold voltage of a reference cell may be established by, for example, having less charge or less bias on a memory cell used as a reference cell.

Figure 2:
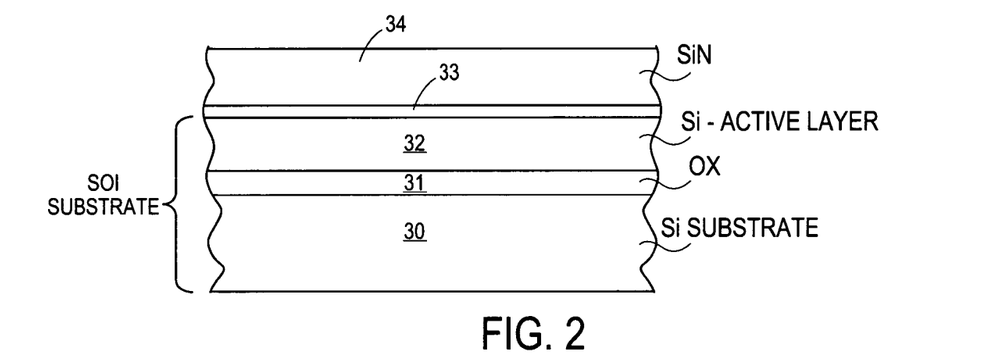
FIG. 2 is a cross-sectional, elevation view of a starting SOI substrate and additional layers.

In one embodiment, the cell is fabricated on an oxide layer 31 which is formed on a silicon substrate 30. Active devices for the memory are fabricated in the monocrystalline silicon layer 32, disposed on the oxide layer 31. This SOI substrate is well-known in the semiconductor industry. By way of example, it is fabricated by bonding a silicon layer onto the substrate 30, and then, planarizing the layer 32 so that it is relatively thin. This relatively thin, low body effect layer, is used for active devices. Other techniques are known for forming the SOI substrate including, for instance, the implantation of oxygen into a silicon substrate to form a buried oxide layer. In the subsequent figures, the memory is shown fabricated on the layer 31, the underlying silicon substrate 30 is not shown.

Figure 3:
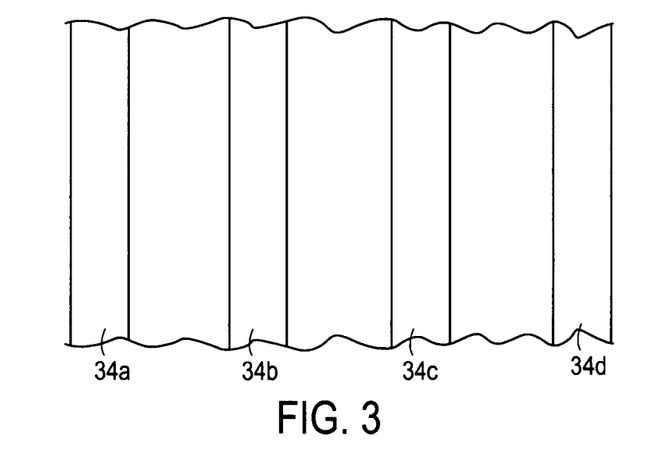
FIG. 3 is a plan view of the structure of FIG. 2 after masking and etching.

In the processing for one embodiment, first a protective oxide 33 is disposed on the silicon layer 32 followed by the deposition of a silicon nitride layer 34. The layer 34 is masked to define a plurality of spaced-apart, elongated, parallel lines and the underlying silicon layer 32 is etched in alignment with these lines. The resultant structure is shown in the plan view of FIG. 3 as four parallel lines 32a, 32b, 32c and 32d, and also in the cross-sectional, elevation views, such as in FIG. 4.

Figure 4:
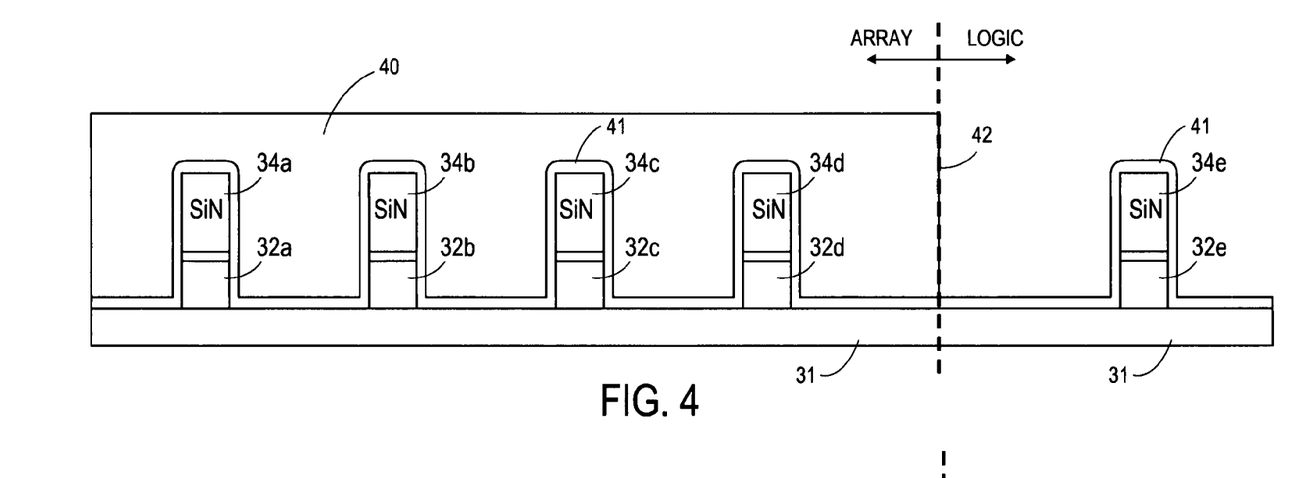
FIG. 4 is a cross-sectional, elevation view of the structure of FIG. 3 and a section of the substrate used for the memory's peripheral circuits.

For the most part, the described processing covers the fabrication of the memory array. While the array is fabricated on a section of the SOI substrate, the peripheral circuits for the memory may be fabricated on other sections of the SOI substrate. In FIG. 4, the memory array is shown to the left of the dotted line 42 on the oxide layer 31, and the logic section of the memory is shown to the right of the dotted line 42, also formed on the oxide layer 31.

Some of the processing for fabricating the array is also used for simultaneously fabricating the peripheral circuits in the logic section. For instance, when the silicon nitride layer 34 is etched, various features may be defined in the logic section such as shown by the nitride member 34e. Then, when the layer 32 is etched, it is etched both in the array and logic section forming, for example, member 32e.

Figure 5:
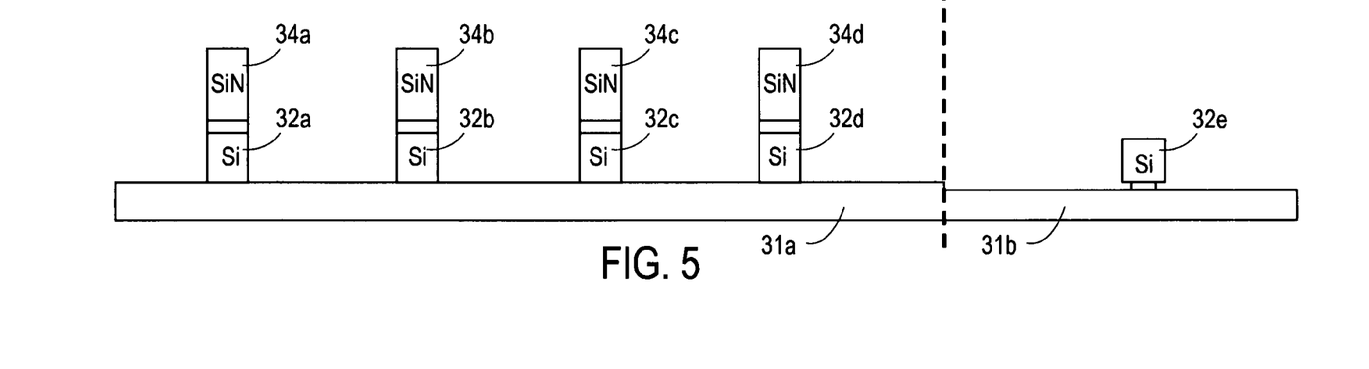
FIG. 5 illustrates the structure of FIG. 4 after additional processing which removes oxide layers.

At times it is necessary to perform separate processing on one of the two sections. FIGS. 4 and 5 illustrate such processing. After the silicon layer 32 is etched, the entire memory is covered with a protective oxide 41. Then, a photoresist layer 40 is formed over the array section of the memory, leaving exposed the logic section. In the logic section, the oxide 41 is removed along with the silicon nitride member 34e, and like members. Next, after the photoresist 40 is removed, the protective oxide 41 is removed from the array section of the memory. The resultant structure is shown in FIG. 5. Note that in FIG. 5, the oxide layer 31b is somewhat thinner than the oxide layer 31a. This occurs because of the additional etching needed to remove the silicon nitride from the logic section. This also causes some undercutting under the member 32e.

Consequently, while the memory is fabricated, processing can occur in one or both sections. The processing in the logic section for the input/output (I/O) data buffers, address buffers, sense amplifiers, refresh amplifiers, address decoders and other circuitry needed to support the array of a DRAM memory is well-known and is therefore not described here.

Typical processing steps, such as well implants, sacrificial oxiding, various cleaning steps, including gate oxide pre-cleaning, are not shown or discussed for either section of the memory. After the gate oxide pre-cleaning, a gate oxide layer is grown on the exposed silicon. Note, particularly in the array section, the gate oxide is grown on the sides of the silicon lines. The top surface of these lines are covered with silicon nitride. This gate oxide is relatively thin and is not shown in the figures.

Figure 6:
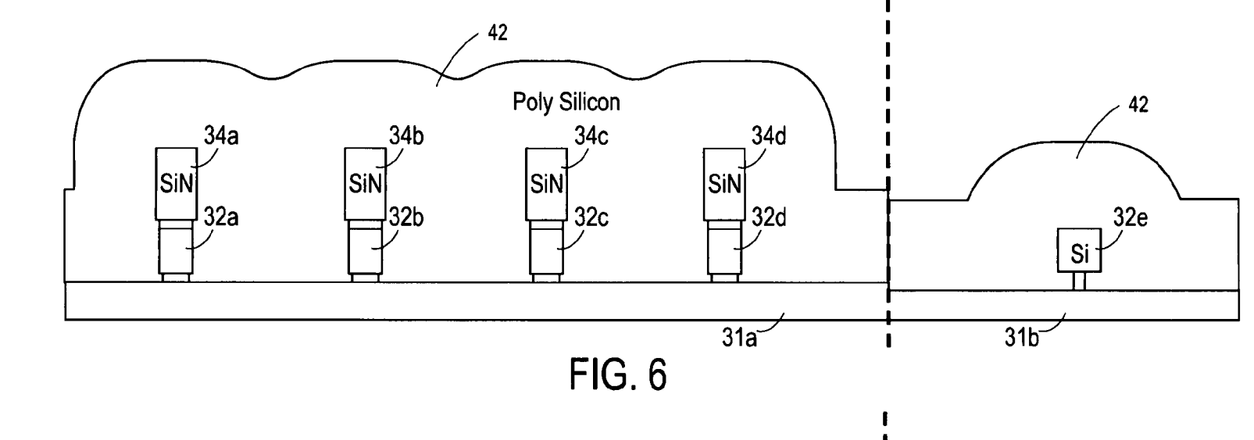
FIG. 6 illustrates the structure of FIG. 5 after the deposition of a polysilicon layer.

Following the gate oxide formation, a polysilicon layer 42 is formed over the entire substrate as shown in FIG. 6. (Note in FIG. 6, some undercutting has occurred under the members 32a-d due to the sacrificial oxide removal and the gate oxide pre-cleaning.) This polysilicon layer is planarized. This planarization occurs to at least the tops of the silicon nitride lines 34a-d, or preferably slightly below these lines to assure that the polysilicon will not have stringers or bridges extending over the silicon nitride. If this occurs, these parasitic paths will short the front and back gates of a cell.

The planarization of the layer 42 can be done with either chemical mechanical polishing (CMP) or with a chemical planarization process. In one embodiment, an oxide is deposited to provide a general level polishing surface between the array and logic sections. Another option is to pattern resist to cover the logic section, followed by a dry etch process to remove polysilicon in the array down to the level slightly below the upper surface of members 34a-d. For this option, a polysilicon spacer may form between the logic and array section. This spacer has no impact on the functionality of the circuits.

Figure 7:
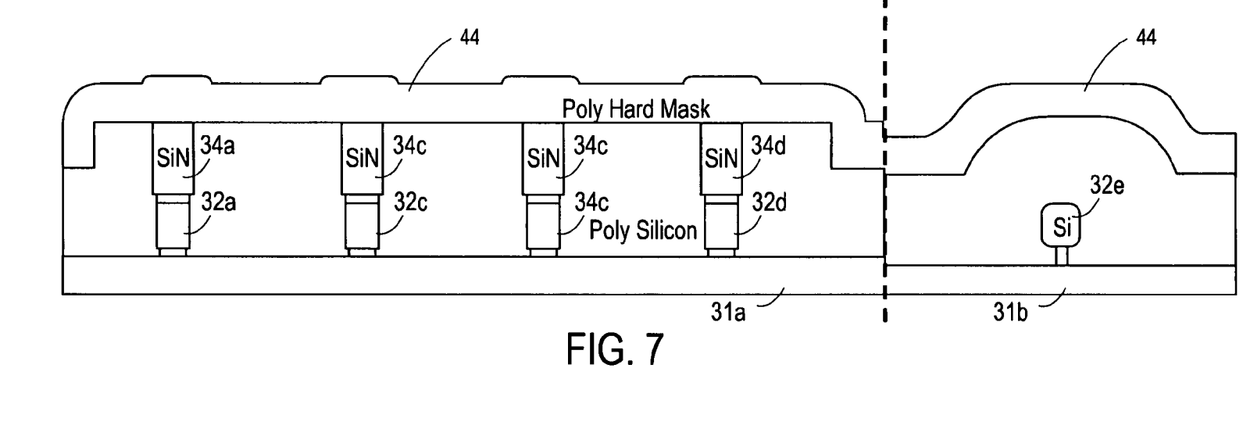
FIG. 7 illustrates the structure of FIG. 6 after the planarization of the polysilicon layer and the deposition of a hard mask layer.
Figure 8:
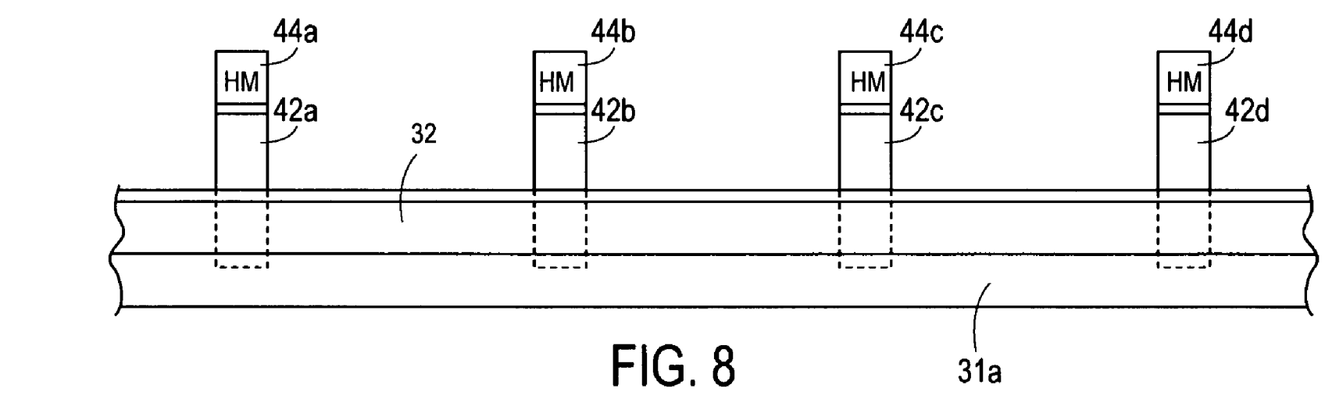
FIG. 8 illustrates the structure of FIG. 7 after etching of the polysilicon layer to define gates in the array.
Figure 9:
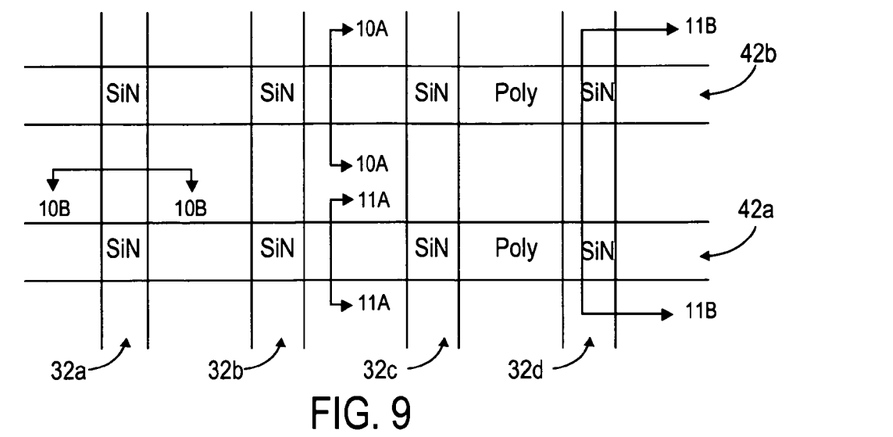
FIG. 9 is a plan view of a portion of the array of FIG. 8.

Now, a hard mask 44, shown in FIG. 7, is applied to allow patterning of the polysilicon. The mask 44 defines a plurality of spaced-apart parallel polysilicon lines generally perpendicular to the silicon lines 32 which are etched in alignment with the hard mask. As shown in FIGS. 8 and 9, these polysilicon lines 42 are interrupted at the intersection of the stack of silicon lines 32 and nitride lines 34. The lines 42, as mentioned above, form the front and back gates. The silicon nitride atop the silicon lines is removed between the polysilicon lines. This may be done now or earlier in the processing. The silicon nitride remains above the silicon bodies to assure that the front and back gates of each memory cell remain insulated from one another.

Figure 10A:
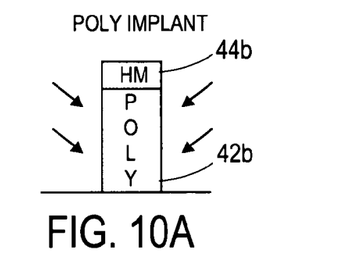
FIG. 10A is a cross-sectional, elevation view the structure of FIG. 9 taken through section line 10A-10A of FIG. 9, illustrating ion implantation.

Now the doping, through implantation, of the polysilicon lines occurs. This is shown in FIG. 10A where the ion implantation occurs at an angle. For the n-channel embodiment described, an n type dopant, such as arsenic, is used to dope the polysilicon to a relatively high doping level so that it is conductive as possible. The conductivity of the polysilicon is not critical as the gate length is less than the spacing between diffusion lines.

Figure 10B:
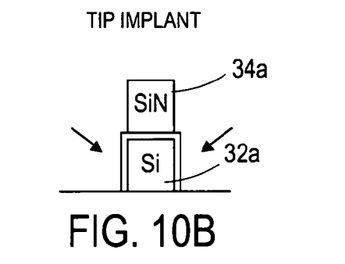
FIG. 10B is a cross-sectional, elevation view of the structure of FIG. 9 taken through section line 10B-10B of FIG. 9 illustrating tip implantation.

Next, as shown in FIG. 10B, a tip implant occurs into the sides of the silicon lines between the cell bodies. This is also done at an angle, however, in a different direction than the polysilicon implant. As is typically the case, this implant is relatively light with an n type dopant. Also, if necessary, a halo implant can be done which is angled-in under the silicon nitride members covering the cell bodies.

Figure 11A:
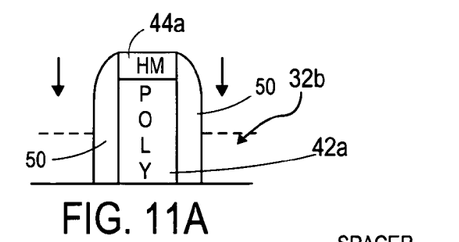
FIG. 11A is a cross-sectional, elevation view of the structure of FIG. 9 after spacers have been formed on the polysilicon gates and during source/drain doping. This figure is taken through section lines 11A-11A of FIG. 9.

A silicon dioxide or silicon nitride layer is formed over the array of FIG. 9 and is etched with an anisotropic etchant, as is often done, to form spacers on the sides of the polysilicon. Another ion implantation process is now used to dope the silicon lines between the spacers to form the main source and drain regions for the cells as shown in FIG. 11A. This is a relatively high level doping implantation with an n type dopant, where as described, an n channel cell is formed in the originally p type doped silicon layer 32.

Figure 11B:
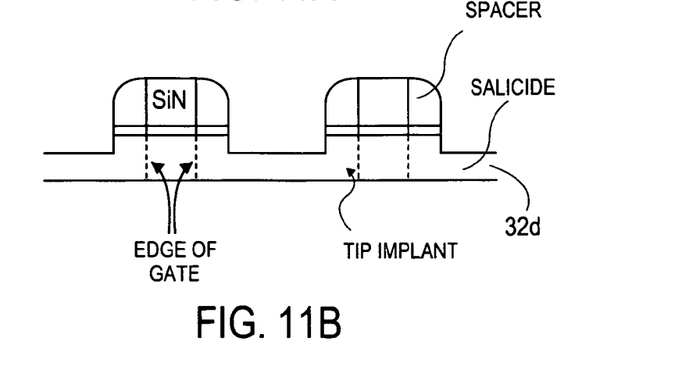
FIG. 11B is a cross-sectional, elevation view of the structure of FIG. 9 taken through section line 11B-11B of FIG. 9 after silicide is formed.

Following, source/drain formation, a well-known self-aligning silicide step (salicide) may be used to reduce the resistance of the exposed silicon. The salicide on the source and drain regions is shown in FIG. 11B. If the hard mask used to etch the polysilicon has a thickness equal to or slightly less than the silicon bodies, then the upper surface of the polysilicon members will also be silicided. If the hard mask is chosen to be thicker, the array polysilicon can be non-silicided for self-aligned contact.

Figure 12:
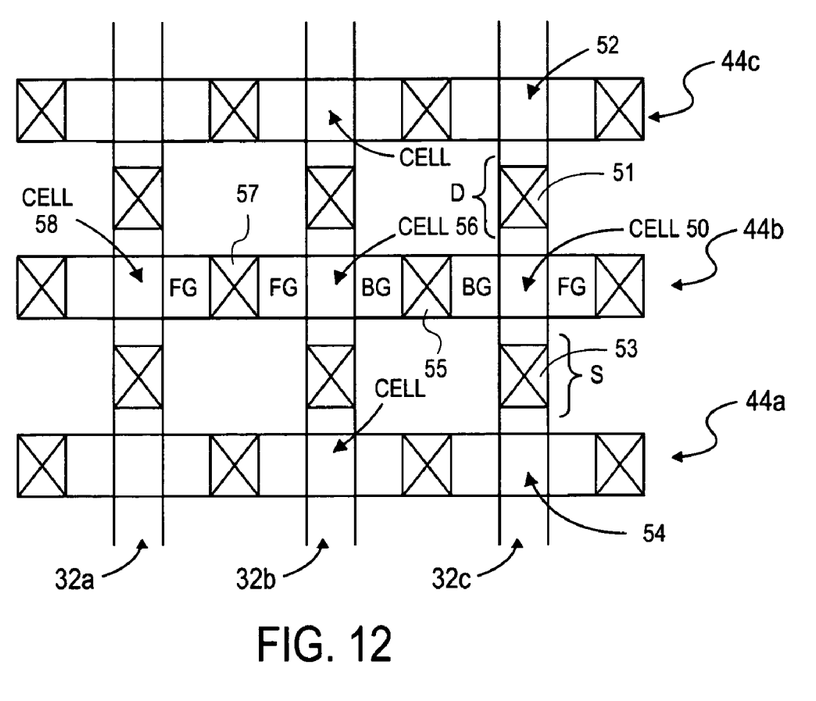
FIG. 12 is a plan view of the memory array used to illustrate the metal contacts made to the array.

Referring first to FIG. 12, again, a plan view of portion of the memory array is shown with the silicon lines 32a, 32b and 32c, and the polysilicon lines 44a, 44b and 44c. The polysilicon lines, as mentioned, are disconnected segments, interrupted at the silicon lines. Several cells are illustrated at the intersection of these lines such as cell 54, along the silicon line 32c.

A contact is made to each of the source and drain regions in the array and each of the front gates and back gates in the array. As can be seen, while each cell is a four terminal device, in fact, in the central portion of the array, since contacts are shared, the number of contacts is equal to half the number of cells. For instance, for cell 50, a contact 53 contacts the source region for this cell. This contact also provides a source region contact for the cell 54. Similarly, the contact 51 contacting the drain region of cell 50 provides a drain region contact for the cell 52. Likewise, the gate contacts are shared. For instance, the back gate for both cells 50 and 56 is the single contact 55. Similarly, the front gate contact 57 provides the front gate control for both the cells 56 and 58. All the contacts shown in FIG. 12 extend upward to one of the metal layers where they terminate in an overlying horizontal metal line or bridge.

Figure 13:
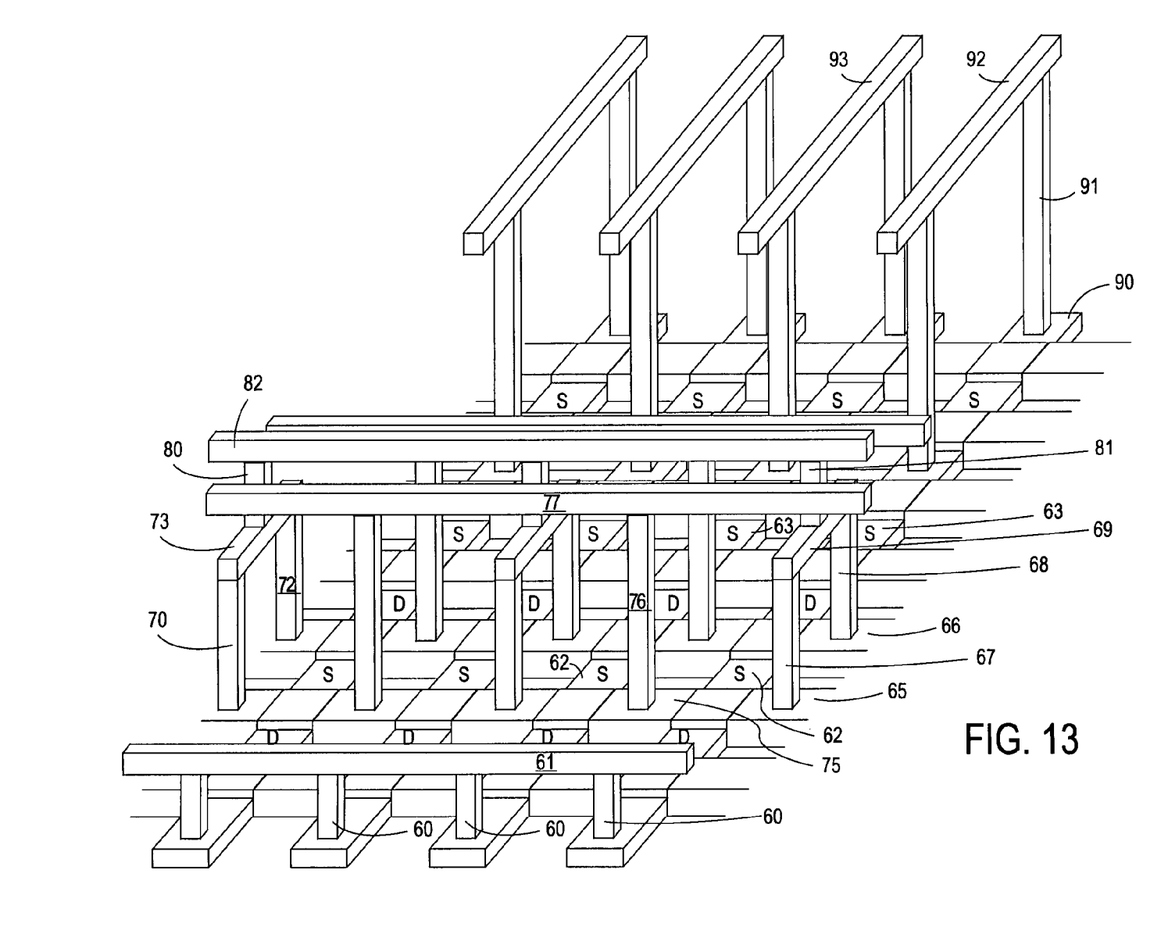
FIG. 13 is a perspective view of the memory array used to illustrate metal contacts in overlying metal lines at several levels.

In one embodiment, four layers of metal are used to provide access to the cells in the array. For this embodiment, all the source regions are connected to lines in the first metalization layer. In FIG. 13, several contacts to source regions 60, along one line of the array, are shown connected to an overlying metal line 61 formed in the first level of metalization. The other source regions are also coupled to lines such as line 61, however, they are not shown in FIG. 13 in order not to overly complicate this figure. For instance, the source regions 62 and the other source regions along this line are also coupled to a line parallel to line 61 in first level of metalization. Similarly, the source regions 63 are also coupled to another line. All of these lines for the described embodiment are connected to ground potential, as shown in FIG. 1.

In the second level of metalization, all the back gates are first paired with short lines or bridges which extend between adjacent back gate contacts. For instance, the back gate 65 and the back gate 66 are connected to the bridge 69 through the contacts 67 and 68, respectively. These contacts extend from the array to the second level of metalization. Similarly, the other back gates along this line are also connected by bridges as shown by contacts 70 and 72, which are interconnected by the bridge 73. All the other back gates in the array are paired in a similar manner.

In metalization level 3 all the front gates are connected to lines, for instance, front gate 75 is connected by the contact 76 to the line 77. The contact 76 extends from the gate, up to the third level of metalization ending in the line 77. Similarly, other lines are defined in this level of metalization and receive the contacts from the other front gates. These lines in level 3 are the word lines of the memory.

Beginning with the second level of metalization and extending to the third level of metalization, contacts such as 80 and 81 are formed midway between the ends of the bridges 69 and 73. These contacts extend up to the third level of metalization to contact a line 82 formed in the third level of metalization. Likewise, all of the other bridges contacting all the other back gates are brought up to this level and connected to lines, such as line 82. These lines are connected to a biasing source.

In the fourth level of metalization, all the drain regions are connected to lines. For example, the drain region 90 is connected through the contact 91 to the line 92. The contact 91 extends from the drain region in the array to the fourth level of metalization. Similarly, all the other drain regions are connected to lines, such as lines 92 and 93.

Alternatively, the drains can be connected to bit lines at the first level of metalization and the sources connected to the grounding lines in the fourth level of metalization.

Figure 14:
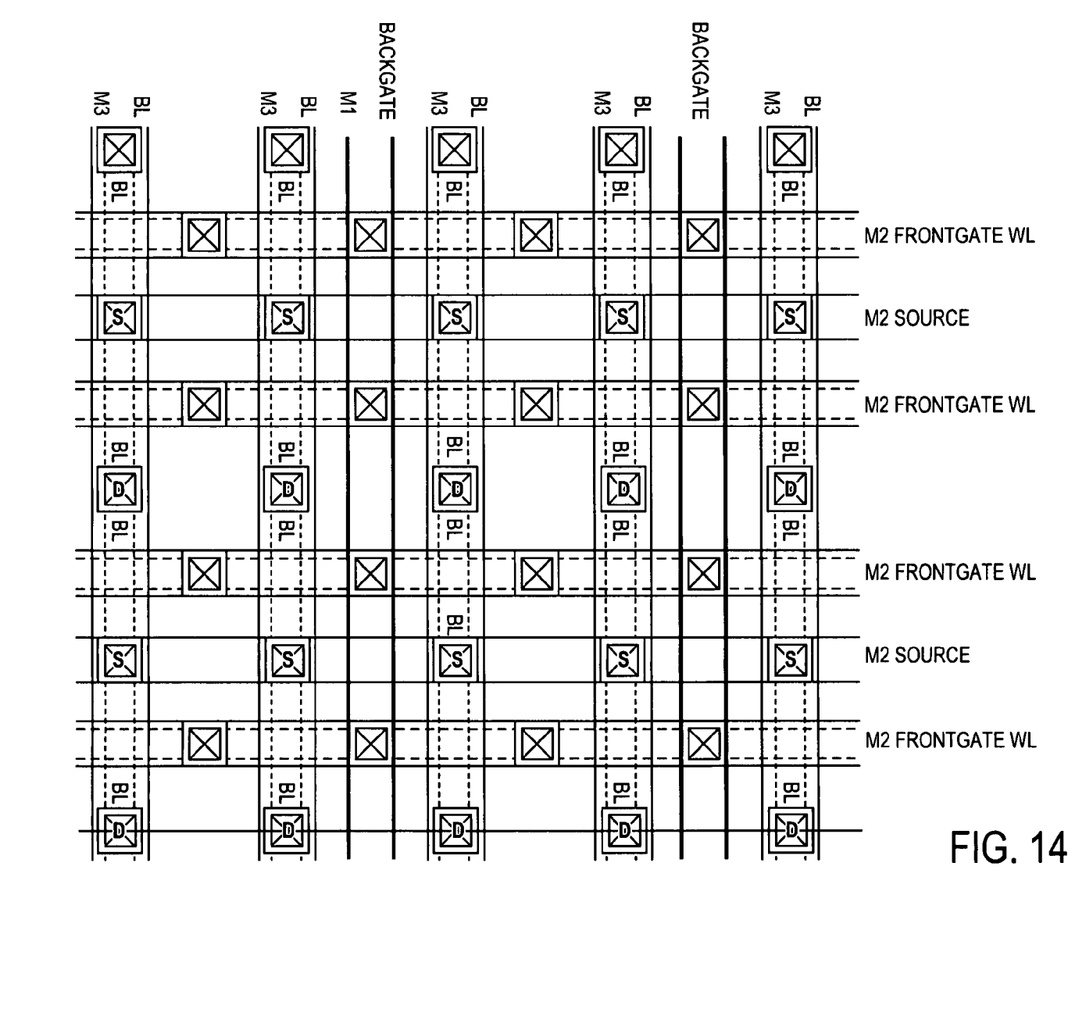
FIG. 14 is a plan view of the memory array used to illustrate another metalization layout.

The metalization may be done in three levels if the array cell size is increased. By way of example, all the back gates can be connected in the first level of metalization if there is more spacing between the backgate and the source/drain contacts. Then both front gates and the sources can be connected by the second level metalization. The drains are connected by the third level metalization. This is shown in FIG. 14. Other connection schemes are possible for different cell sizes.

A memory as described above may have several subarrays of cells. Moreover, the subarray of cells may be bisected by a row or column of sense amps. Accordingly, logic sections may surround several subarrays of cells.

Thus, a DRAM has been disclosed, fabricated on an SOI substrate employing a single body device for each cell.

What is claimed is:

1. A memory comprising:
   an array of cells, the cells having first gate contacts, second gate contacts, source region contacts and drain region contacts;
   overlying metal bridges connected between pairs of the second gate contacts in an overlying metal layer; and
   additional contacts contacting the bridges and connecting them to lines in another overlying metal layer.

2. The memory defined by claim 1, wherein the first gate contacts are connected to word lines in the array.

3. The memory defined by claim 2, wherein the drain region contacts are connected to bit lines in the array.

* * * * *